United States Patent [19]

Little

[11] 4,350,561

[45] Sep. 21, 1982

[54] SINGLE CRYSTAL PROCESSES AND PRODUCTS

[75] Inventor: Roger G. Little, Bedford, Mass.

[73] Assignee: Spire Corporation, Bedford, Mass.

[21] Appl. No.: 150,331

[22] Filed: May 16, 1980

[51] Int. Cl.³ .............................................. B01J 17/04
[52] U.S. Cl. ............................ 156/624; 156/DIG. 88;
156/647; 156/662
[58] Field of Search .............. 156/600, 608, 612, 610,
156/DIG. 102, 614, 59, 613, 647, DIG. 8, DIG.
73, DIG. 88, 624; 264/220, 226, 227; 427/35,
84, 38, 86, 42, 255, 87

[56] References Cited

U.S. PATENT DOCUMENTS

| 3,370,980 | 2/1968 | Anderson | 156/600 |
|---|---|---|---|
| 4,032,960 | 6/1977 | Anthony et al. | 357/60 |
| 4,046,618 | 9/1977 | Chaudhari et al. | 156/DIG. 88 |
| 4,116,751 | 9/1978 | Zaromb | 156/600 |
| 4,137,123 | 1/1979 | Bailey et al. | 156/647 |
| 4,153,654 | 5/1979 | Maffitt et al. | 264/220 |
| 4,196,041 | 4/1980 | Baghdadi et al. | 156/DIG. 86 |
| 4,199,397 | 4/1980 | Guntler | 156/DIG. 88 |
| 4,211,821 | 7/1980 | Hadni | 156/DIG. 88 |
| 4,227,961 | 10/1980 | Takagi | 156/DIG. 102 |

Primary Examiner—Stanley S. Silverman
Attorney, Agent, or Firm—Morse, Altman, Oates & Dacey

[57] ABSTRACT

The surface of a starting single crystal of specified composition (e.g., silicon) is etched to produce a relief texture; a stratum of release composition (e.g., aluminum) is deposited on the relief texture to acquire a replica texture and is released to provide a replica master; a replica stratum of the specified composition in the amorphous or polycrystalline state is deposited on the replica master in order to acquire the original relief texture. It has been found that, when the replica stratum is recrystallized, it assumes a replica single crystal structure corresponding to the starting single crystal structure.

7 Claims, 5 Drawing Figures

SINGLE CRYSTAL PROCESSES AND PRODUCTS

BACKGROUND OF THE INVENTION

1. Field of the Invention

The present invention relates to single crystal structures and, more particularly, is directed towards a method for forming single crystal structures which are replicas of a starting single crystal of specified composition. The resultant replica single crystal structures, for example, are designed for fabricating solar cells or infrared detectors therefrom after further processing.

2. The Prior Art

Single crystal wafers formed from silicon, germanium or gallium arsenide serve as suitable materials for fabricating energy-efficient solar cells. Texture-etching of such wafers results in improved efficiency; the reason for such improvement is that the many facets and the differing angles and spacings among the facets of a texture-etched surface significantly increase the amount of solar energy absorption in a solar cell so formed. Presently, such single crystal wafers are grown in furnaces and the wafers then are texture-etched. This furnace-grown procedure is both inefficient and wasteful, hence expensive. The procedure is inefficient for it requires a great deal of energy to grow, in a furnace, large-grain single crystal wafers needed for making solar cells. The procedure is wasteful since about less than half of the wafers so grown pass the rigid requirements for service as base materials being fabricated into solar cells.

Recently, attempts have been made to grow large-grain crystal sheets from amorphous silicon films deposited on substrates formed with a one dimensional artificial surface-relief grating. Such a one dimensional surface-relief grating includes square-wave and sawtooth channels formed in the surface of the substrate, which channels comprise periodic arrays of facets that meet at 90° angles to each other. See Technical Report 533 of M.I.T. Lincoln Laboratory Ltd. Dec. 5, 1978, D. C. Flanders, "Orientation of Crystalline Overlayers on Amorphous Substrates by Artificially Produced Surface Relief Structures." After deposition, the films are scanned with a laser beam to effect crystallization. The scanned films exhibit a one dimensional crystalline orientation as determined by the surface-relief grating. The resultant sheets are but small-grain polycrystal silicon sheets, unusable for fabricating solar cells therefrom. These attempts thus have failed to provide an acceptable fabrication technique for growing large-grain single crystal sheets of the type required to make solar cells therefrom.

SUMMARY OF THE INVENTION

It is a principal object of the present invention to overcome the above shortcomings by providing a two dimensional crystal replication method for forming thin amorphous films into large-grain single crystal sheets.

More specifically, it is an object of the present invention to provide an efficient, two dimensional crystal replication method for forming thin amorphous or polycrystalline films into large-grain single crystal sheets by employing a replica master of a texture-etched surface of a starting single crystal structure to form a replica single crystal structure corresponding to the starting single crystal structure.

Briefly, the two dimensional crystal replication method of the invention includes the steps of texture-etching a surface of a starting single crystal structure, making a replica master of the texture-etched surface, depositing a replica stratum in the amorphous or polycrystalline state onto the replica master, and recrystallizing the replica stratum to form a replica single crystal structure corresponding to the starting single crystal structure. The texture-etched surface is uniquely characteristic of the specified composition being used for forming the starting single crystal structure.

BRIEF DESCRIPTION OF THE DRAWINGS

For a fuller understanding of the nature and objects of the present invention, reference is made to the following specification, which is to be read in reference to the accompanying drawings, wherein.

DETAILED DESCRIPTION OF THE PREFERRED EMBODIMENT

The illustrated method of the present invention generally comprises the steps of etching a surface of a starting single crystal of specified composition (e.g., silicon) to produce a relief texture characteristic of the specified composition; making a replica master with an acquired texture mirroring the relief texture; depositing a replica stratum of the specified composition (e.g., silicon) in the amorphous or polycrystalline state on the replica master, and recrystallizing the replica stratum to form a replica single crystal structure corresponding to the starting single crystal structure.

The specified composition is preferably a composition selected from the group consisting of silicon (Si), germanium (Ge) and gallium arsenide (GaAs), which are used in the fabrication of solar cells, and cadmium telluride (CdTe) and mercury-cadmium telluride (HgCdTe), which are used in the fabrication of infrared detectors.

The method of the invention is based upon the principles of equilibrium thermodynamics which state that the preferred crystal orientation of an anisotropic material is a configuration of minimum free energy. The acquired relief texture of the replica master causes anisotropic interfacial tension in the replica stratum of the specified composition (e.g., silicon) such that the replica stratum assumes a unique, single crystal orientation upon being recrystallized. An essential point in achieving this final result is that the spacings between the peaks and valleys of the replica master correspond to the exact values of a single crystal; thus separate regions of the replica stratum upon recrystallization will be exactly matched as to orientation and spacing so as to make the entire surface of the replica stratum indistinguishable from a single crystal.

Figure 1:
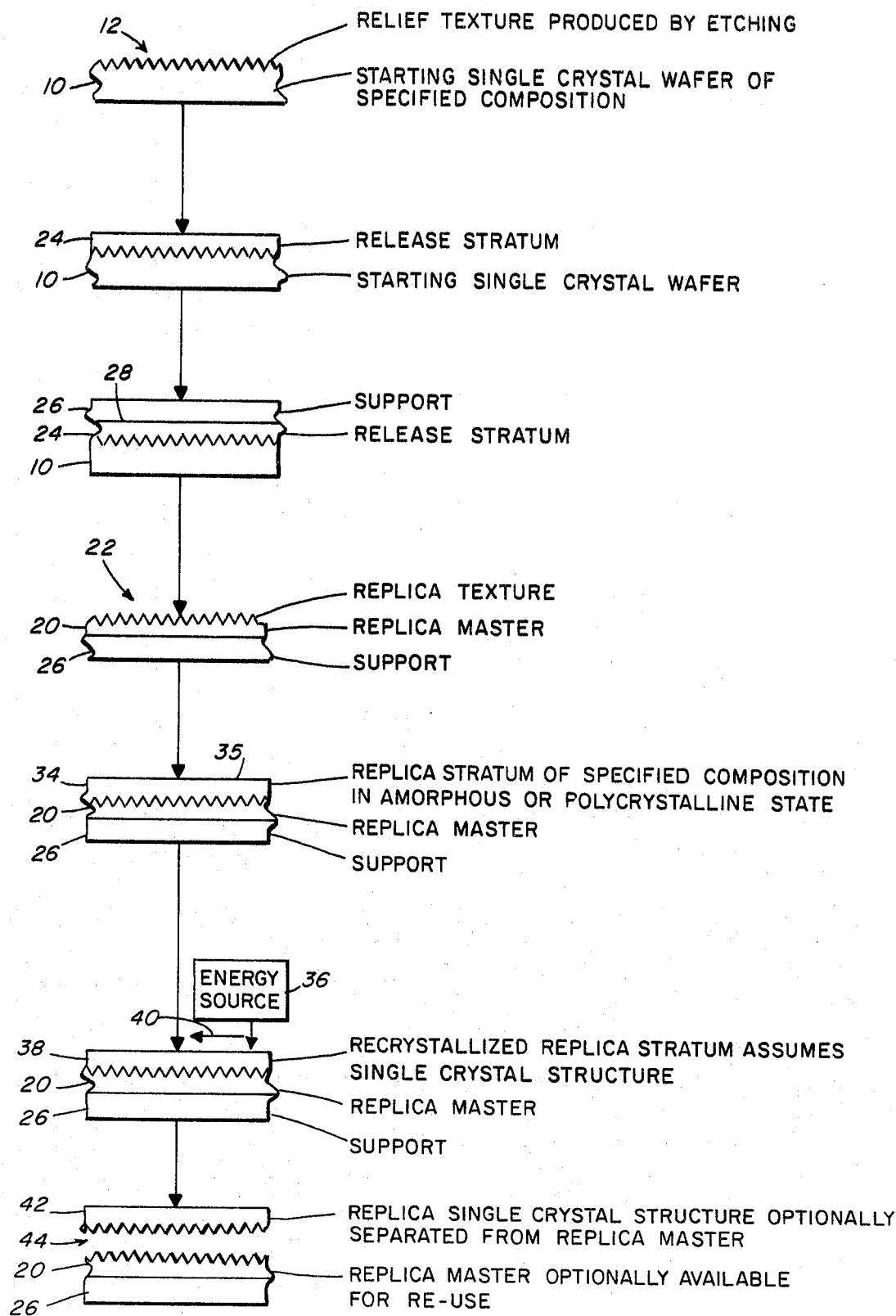
FIG. 1 is a flow diagram showing the several steps of the method of the invention and certain intermediate and final products thereof.
Figure 2:
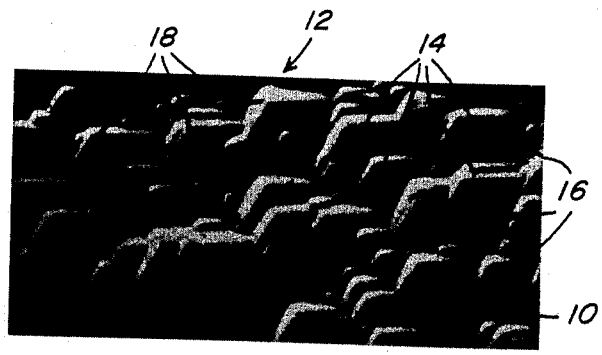
FIG. 2 is a perspective view, on an enlarged scale, of a texture-etched surface of a starting single crystal wafer structure.
Figure 3:
FIG. 3 is a perspective view, on an enlarged scale, of the texture-etched surface shown in FIG. 2 after a stratum of release composition has been deposited thereon.

Referring to FIG. 1, which is a flow diagram showing the several steps of the method and certain intermediate and final products thereof, there is shown a schematic cross-sectional view of a starting single crystal wafer 10 formed of the specified composition. The upper surface of the starting single crystal wafer 10 is etched to produce a relief texture 12. The relief texture 12 is uniquely characteristic of the specified composition forming the starting single crystal wafer 10. The etching procedure is effected in an aqueous inorganic acid solution, for example, a potassium hydroxide (KOH) or nitric acid ($HNO_3$) solution. The depth of the etch preferably varies from about 0.5 micron to about 10 microns. FIG. 2 depicts, in perspective and on an enlarged scale, the relief texture 12 of the starting single crystal wafer 10 of FIG. 1. The relief texture 12 is characterized by a plurality of planar facets 14 separated by a plurality of valleys 16, defining a positive mold of generally pyramidal configuration, with a number of differently sized and shaped pyramids 18. The peaks of these pyramids 18 characteristically are between about one and three microns above the valleys 16.

The steps of making a replica master 20, with a replica texture 22 mirroring the relief texture 12 of the starting single crystal wafer 10, are schematically illustrated in FIG. 1. First, a stratum 24 of release composition is deposited on the relief texture 12 to acquire the replica texture 22. Suitable release compositions for the release stratum 24 includes metals and non-metals such as aluminum (Al), nickel (Ni), molybdenum (Mo), tungsten (W), carbon (C), and titanium (Ti) and alloys and compounds of these metals. The release stratum 24 preferably is deposited on the relief texture 12 of the starting single crystal wafer 10 be evaporation, e.g., vacuum vapor deposition or chemical vapor deposition. The thickness of the release stratum 24 preferably varies from about 0.1 micron to about ten microns, depending on final application of the resultant replica master 20.

Next, a support 26 is attached to the release stratum 24. If the support 26 is formed of metal, the support 26 preferably is attached to the release stratum 24 with a thin bonding interface layer 28, for example, composed of an epoxy bonding agent. The function of the support 26 is to provide structural strength to the release stratum 24. In one embodiment, the support 26 is formed of any metal, including aluminum (Al) or steel, or a combination of two or more metals. In another embodiment, the support 26 is formed of glass, such as a boronsilicate glass, that is electrostatically bonded to the release stratum 24. A glass support 26 is particularly advantageous in that it also provides an integral back surface encapsulant to the stratum 24 and hence to the resultant replica master 20. If the deposited release stratum 24 is capable of being self-supporting and the support 26 is not needed or desired in the final product, then this step of attaching the support 26 to the release stratum 24 can be dispensed with.

Figure 4:
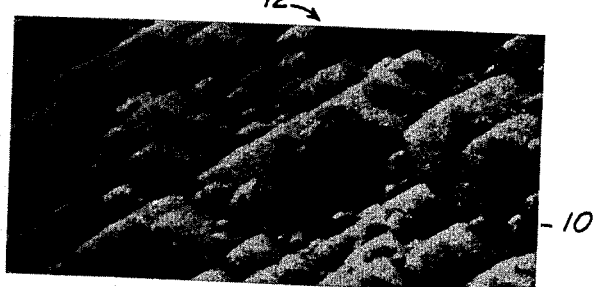
FIG. 4 is a perspective view, on an enlarged scale, of the texture-etched surface shown in FIG. 2 after the stratum of FIG. 3 has been released from the surface.
Figure 5:
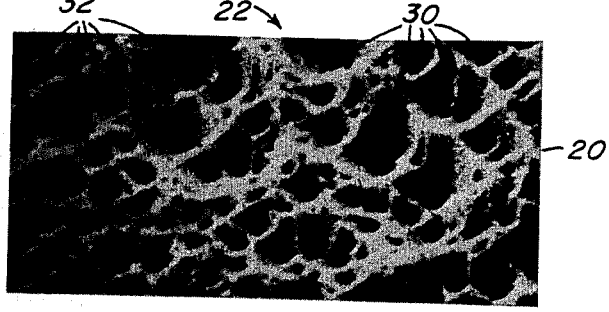
FIG. 5 is a perspective view, on an enlarged scale, of a replica master of the starting single crystal wafer structure shown in FIG. 2.

The hardened stratum 24 of release composition, if self-supporting, is carefully released from the starting single crystal wafer 10 to provide the replica master 20. This release of the stratum 24 from the wafer 10 is facilitated by raising the temperature of both the wafer 10 and the stratum 24 so as to effect a sheer release. If the stratum 24 has been provided with a support 26, then the support 26 is used to facilitate the release of the stratum 24 from the starting single crystal wafer 10. In either event, following release of the stratum 24, the stratum 24 is inverted to provide the replica master 20, shown in perspective in FIG. 5. FIG. 4 is a perspective view of the texture-etched surface 12 of the starting single crystal wafer 10 after the release of the stratum 24 therefrom. The texture-etched surface 12 has undergone no apparent change as a consequence of making the replica master 20. As a result, the replica texture 22 has a fine resolution that faithfully mirrors the relief texture 12 of the starting single crystal wafer 10.

The replica texture 22 is formed with a plurality of planes 30 and ridges 32 that correspondingly mirror the plurality of planar facets 14 and valleys 16 of the relief texture 12. The planes 30 and ridges 32 of the replica texture 22 thus cooperate to define a negative mold of the relief texture 12 embodied in the replica master 20. The replica master 20, with or without the support 26, is ready to be employed in the next step of the method.

A replica stratum 34 of the specified composition in the amorphous or polycrystalline state is next deposited on the replica master 20 in order to acquire the original relief texture 12 of the starting single crystal wafer 10. The replica stratum 34, having an upper surface 35, is deposited on the replica master 20 in various ways. Some of these include chemical vapor deposition (CVD), low pressure chemical vapor desposition (LPCVD), plasma ion deposition or evaporation method. The thickness of the deposited replica stratum 34 varies from about 0.1 micron to about ten microns. The thickness of the replica stratum 34 is determined according to several parameters, including the amount of the average electron energy obtainable from a suitable pulsed energy source to effect the recrystallization of the replica stratum 34. The preferred thickness for the deposited replica stratum 34 is about one micron. It is understood that the greater the thickness of the replica stratum 34, the greater will be the amount of the electron energy that will be required to effect its recrystallization.

Recrystallization of the replica stratum 34 of the specified composition is the next succeeding step. A suitable pulsed energy source 36 is used to melt and thus to crystallize the replica stratum 34 into a recrystallized state 38. The pulsed energy source 36 is preferably a laser or an electron beam gun, having at least twelve keV average electron energy available per pulse. The replica stratum 34 is raster scanned by the energy source 36 as indicated by the horizontal arrow 40. It is preferred that the entire deposited thickness of the replica stratum 34 be melted, hence recrystallized, by the pulsed energy source 36 without melting the replica master 20, however. This is assured by selecting a material for forming the replica master 20 that has a melting point higher than that of the replica stratum 34. Furthermore, the material forming the replica master 20 also possesses a high thermal conductivity, enabling thereby the replica master 20 also to serve as a heat sink for the pulsed energy during the recrystallization step. Raster scanning 40 is accomplished by effecting relative motion between the energy source 36 and the combined replica master 20 and the replica stratum 34. If the thickness of the deposited replica stratum 34 exceeds one micron, then multiple raster scans of the replica stratum 34 will be required thoroughly to melt the replica stratum 34 and to transform it into the recrystallized state 38. It has been found that, when the replica stratum 34 is recrystallized, it assumes a replica single crystal structure 42 which corresponds to the single crystal structure of the starting single crystal wafer 10. It has also been found that, when the replica single crystal structure 42 is optionally separated from the replica master 20, the structure 42 has acquired a relief texture 44 which is akin to the original relief texture 12 of the starting single crystal wafer 10.

The final product of the method of the invention is represented either by the recrystallized replica stratum 38 remaining together with the replica master 20 and its support 26, or by the replica single crystal structure 42 optionally separated from the replica master 20. When opting for the separation of the replica single crystal structure 42 from the replica master 20, then the replica master 20 is optionally available for reuse in one of two ways. First, the replica master 20 can be used to receive a second deposition (and subsequent depositions, if desired) of a replica stratum 34 of the specified composition. This second (and subsequent) replica stratum 34 is then recrystallized by the energy source 36 into the recrystallized state 38. The resultant single crystal structure 42 can then again be optionally separated from the replica master 20 in order to repeat the above procedure. Second, the replica master 20 can be used in lieu of the starting single crystal wafer 10 so as to produce a second replica master from the original replica master 20. This is done by depositing a stratum 24 of release composition on the original replica master 20, securing a support 26 thereto, and having the stratum 24 released therefrom to provide the second replica master. This second replica master can then be used to form a product, after receiving, and subsequently recrystallizing, a replica stratum 34 of the specified composition in the amorphous or polycrystalline state. The second replica master also can be made optionally available for reuse, as per the above, upon its being separated from the replica single crystal structure 42. Thus, one starting single crystal wafer 10, duly etched to produce the relief texture 12, can be used to fabricate a multiplicity of replica masters 20, and each such replica master 20 can be used to form the combination product or to make yet more replica masters 20.

The following specific example further describes the process of the present invention.

EXAMPLE I

As a specific example, a three-inch diameter starting single crystal wafer 10 of specified composition, e.g., of Czochralski-grown silicon (Si), is texture-etched in a potassium hydroxide (KOH) solution to produce a relief texture 12. The depth of the etch is preferably selected to be two microns and the thickness of the wafer 10 ten microns. The etching produces a plurality of planar facets 14 with a (100) direction of orientation characterized by having minimum interfacial tension. It is understood that the (100) orientation of these planar facets 14 of the relief texture 12 having the minimum interfacial tension define the direction for crystal growth.

A stratum 24 of release composition (e.g., aluminum) then is evaporated upon this relief texture 12 of the silicon wafer 12 to a thickness of about ten microns to acquire a replica texture 22 thereof. A support 26, formed of boronsilicate glass of about ⅛ of an inch thickness, is next electrostatically bonded to the release stratum 24 so as to provide a back surface encapsulant, in addition to providing support, to the release stratum 24. The temperature of the combination of silicon wafer 12, release stratum 24 and support 26 is now raised to 250° F. and the stratum 24 shear released to provide the replica master 20. The replica texture 22 of the replica master 20 is formed with a plurality of planes 30 (note FIG. 5) which correspond to the plurality of planar facets 14 (note FIG. 2) with the (100) direction of orientation characterized by having minimum interfacial tension. It is these planes 30, also of minimum interfacial tension, that determine the crystal growth in the replica stratum 34 during its recrystallization.

A replica stratum 34 of the specified composition (e.g., silicon) in the amorphous state then is deposited to one micron thickness on the replica texture 22 of the replica master 20 by chemical vapor deposition (CVD). Silicon in the amorphous state, rather than in the polycrystalline state, is preferred because it is easier to pulse crystallize due to its lower melting point, lower heat of fusion and higher specific heat capacity. The replica stratum 34 is recrystallized, using a pulsed electron beam gun as the energy source 36. This energy source 36 preferably has a fluence of about 0.22 cal/cm$^2$ and a mean energy of about twelve keV per electron beam pulse, resulting in a peak temperature of about 1600° C. in the replica stratum. The energy delivered causes a thorough melting of the replica stratum 34, followed by rapid cooling of the melt by thermal conduction occurring into the aluminum replica master 20. The cooling front in the melt moves from the depth of the replica texture 22, represented by its planes 30 of minimum interfacial tension, to the peaks of the replica texture 22, represented by its ridges 32 (observe FIG. 5), and hence to the upper surface 35 of the replica stratum 34. As a consequence, the replica stratum 34 acquires a thoroughly recrystallized state 38, with a relief texture 44 that is analogous to the original relief texture 12 of the starting single crystal wafer 10. Furthermore, due to the (100) direction of orientation of the planes 30 of minimum interfacial tension, the crystal growth in the replica stratum 34 during its recrystallization proceeds in such a manner that the recrystallized replica stratum 38 assumes a replica single crystal structure 42 which corresponds to the starting single crystal wafer structure 10.

In order to fabricate solar cells from the final products of the method of the invention, the thickness of the recrystallized replica stratum 38 has to be increased to at least ten and preferably to about thirty microns. Such required thickness is achieved either by repeating several times the deposition of a new replica stratum 34 on top of the recrystallized replica stratum 38, followed by its recrystallization, or by epitaxially growing additional single crystal structures of the specified composition on top of the recrystallized replica stratum 38. Once the required thickness is achieved, solar cells are formed from the products by ion-implantation and pulse annealing to introduce p and n junctions therein, followed by electrostatic bonding for trapped mesh metallization and concurrent encapsulation.

The method of the invention, therefore, eliminates the costly and energy-inefficient high temperature crystal growth procedures presently employed for making solar cells. The method of the invention also eliminates the waste of material presently experienced during the wafering step in making solar cells. The method of the invention is also economical in that it permits the optional multiple-use of the replica master 20 in replicating single crystal structures 42, or even replicating replicas of replica masters 20.

Thus, it has been described an efficient method for forming replica single crystal structures 42 and recrystallized replica stratums 38 on original or second replica masters 20 useful in the production of solar cells, which method satisfies the object and advantages set forth above.

Since certain changes may be made in the present disclosure without departing from the scope of the invention involved herein, it is intended that all matter described in the foregoing specification or shown in the accompanying drawings be interpreted in an illustrative and not in a limiting sense.

What is claimed is:

1. A method for forming a single crystal structure which is a replica of a starting single crystal structure comprising:
   (a) texture etching a surface of a starting single crystal structure of a specific crystalline orientation;
   (b) making a replica master of said texture-etched surface of said starting single crystal structure;
   (c) depositing a replica stratum in the amorphous state on said replica master; and
   (d) recrystallizing said amorphous replica stratum to form a replica single crystal structure corresponding in crystalline orientation to said specific crystalline orientation of said starting single crystal structure and with a relief surface analogous to the texture-etched surface of said starting single crystal structure.

2. The method of claim 1 wherein said starting single crystal structure and said replica single crystal structure are each formed of a specified composition.

3. The method of claim 2 wherein said specified composition is a composition selected from the group consisting of silicon, germanium, gallium arsenide, cadmium telluride or mercury-cadmium telluride.

4. A method for forming a replica single crystal structure from a replica stratum of specified composition in amorphous or polycrystalline state comprising:
   (a) texture-etching a surface of a starting single crystal wafer to produce a relief texture characteristic of the specified composition forming said wafer;
   (b) making a replica master with a replica texture mirroring said relief texture;
   (c) depositing a replica stratum of said specified composition in amorphous or polycrystalline state on said replica texture of said replica master; and
   (d) exposing said deposited replica stratum to a pulsed energy source to form a replica single crystal structure corresponding in crystalline orientation to said starting single crystal wafer.

5. The method of claim 4 wherein said specified composition is a composition selected from the group consisting of silicon, germanium, gallium arsenide, cadmium telluride or mercury-cadmium telluride.

6. A method for forming a single crystal structure which is a replica of a starting single crystal structure comprising:
   (a) texture etching a surface to a depth of about two microns of a starting single crystal structure of specified composition and crystalline orientation and of a thickness of about ten microns to produce a relief texture uniquely characteristic of said specified composition;
   (b) depositing a stratum of release composition on said relief texture to acquire a replica texture thereof;
   (c) releasing said stratum of release composition to provide a replica master with said replica texture of said relief texture;
   (d) depositing a replica stratum of said specified composition in the amorphous or polycrystalline state on said replica texture of said replica master to acquire said relief texture; and
   (e) recrystallizing said replica stratum by quickly melting it at an elevated temperature, followed by rapid cooling of the melt by thermal conduction into said replica master to form a replica single crystal structure whose relief texture and crystalline orientation correspond to said relief texture and crystalline orientation of said starting single crystal structure.

7. The method of claim 6 wherein said specified composition is a composition selected from the group consisting of silicon, germanium, gallium arsenide, cadmium telluride or mercury-cadmium telluride.

* * * * *